FREQUENCY SWEEP CIRCUIT FOR PHASE CONTROLLED OSCILLATOR

Filed June 25, 1963 2 Sheets-Sheet 1

INVENTOR
KUNIO KAWAI
BY Paul M. Craig, Jr.
ATTORNEY

INVENTOR
KUNIO KAWAI
BY Paul M. Craig, Jr.
ATTORNEY

United States Patent Office 3,260,958

Patented July 12, 1966

3,260,958

FREQUENCY SWEEP CIRCUIT FOR PHASE CONTROLLED OSCILLATOR

Kunio Kawai, Tokyo, Japan, assignor to Hitachi, Ltd., Tokyo, Japan, a corporation of Japan Filed June 25, 1963, Ser. No. 290,547
Claims priority, application Japan, June 25, 1962, 37/25,713
5 Claims. (Cl. 331—4)

This invention relates to automatic frequency sweep oscillators.

Conventional automatic frequency sweep oscillator circuits for example used in the channel selection of multichannel transmitter-receiver circuits have involved a complicated circuit arrangement or unsatisfactory performance characteristics. The present invention is intended to provide a master oscillator of the automatic sweep type having a simplified circuit arrangement compared with conventional ones and fully capable of generating a signal in synchronism with the input signal.

The present invention will now be described in detail with reference to the accompanying drawings, in which.

FIGS. *5a* and *5b* are a circuit diagram of the essential part of the oscillator constructed according to the invention and a graphical representation of its characteristic, respectively.

Figure 1:
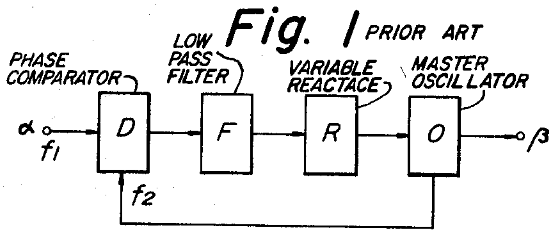
FIGS. 1 and 2 are block diagrams of respective conventional oscillator devices.

Referring first to FIG. 1, there is illustrated a conventional form of oscillator circuit of the kind described which includes a master oscillator O, a phase comparator D, a low-pass filter F and a variable reactance circuit R such as a variable capacitor diode, said components being arranged so that the oscillation frequency $f_2$ of the master oscillator O is precisely synchronized with the input signal frequency $f_1$. In more detail, the phase comparator D is provided to detect any phase difference between the input signal to the circuit having a frequency $f_1$ and the output signal from the master oscillator having a frequency $f_2$ and a differential frequency component $(f_1—f_2)$ obtained through the low-pass filter F is applied to the variable reactance circuit R for the purpose of controlling the oscillation frequency of the master oscillator O, which is associated with the circuit R.

As a matter of fact, however, this form of oscillator circuit has generally been unsatisfactory in practical applications because of the circuit characteristics of the phase comparator D, variable reactance circuit R and other circuit components since the output frequency $f_2$ of the master oscillator cannot be synchronized with the frequency $f_1$ of the input signal unless the values of the signal frequencies $f_1$ and $f_2$ approach each other to a more or less extent, i.e., unless the value of the frequency differential $(f_1—f_2)$ lies within a predetermined frequency range. In addition, the master oscillator O generally has a very limited frequency stability, usually having an output frequency $f_2$ very remote from the said synchronizable frequency range, that is, so-called "pull-in range."

Figure 2:
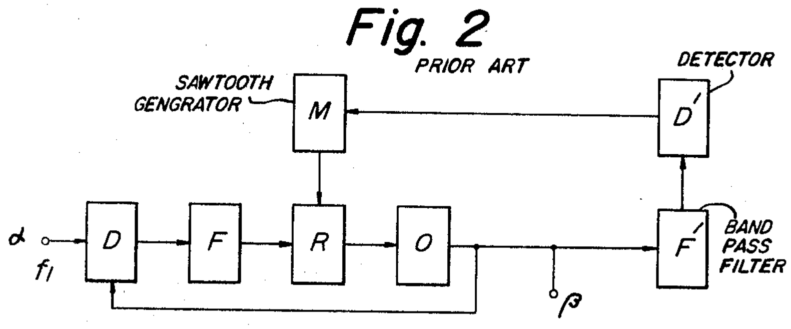

To avoid such difficulties, use has been made of a circuit arrangement as illustrated in FIG. 2 in which a saw-toothed voltage generator M having a multivibrator is provided and the generator output is applied to said variable reactance circuit R for the purpose of sweeping the oscillation frequency of the master oscillator O to shift the frequency $f_2$ into the pull-in range.

Such circuit arrangement is complicated having an increased number of circuit components and thus is liable to get out of order, as it necessitates an active circuit for externally producing a voltage to be applied to shift the oscillation frequency $f_2$ of the master oscillator into the pull-in range. In addition, it includes a means for discontinuing the supply of the saw-toothed voltage immediately after the input signal frequency $f_1$ and the output frequency $f_2$ of the master oscillator have been synchronized with each other, for example, in the form of an arrangement including a narrow band pass filter F′ having the center frequency of $f_1$ and a detector D′ which receives the output of the oscillator coming through said filter F′ and produces an output which is employed to render the saw-toothed voltage generator M inoperative.

The present invention has overcome these deficiencies of conventional oscillators of the kind and description will now be made with reference to FIG. 3, which illustrates one embodiment of the invention.

Part of the output of the oscillator O is added to the variable reactance circuit R, for example, including a a reactance tube, a variable capacitance diode or the like element through a frequency discriminator K, which includes coils $L_1$, $L_2$, condensers $C_1$, $C_2$, diodes $D_1$, $D_2$ and resistors $R_1$, $R_2$, as shown in FIG. *5a*. Coil $L_1$ and capacitor $C_1$ together form a resonance circuit having a resonance frequency of $f_1+\Delta_f$ while $L_2$ and $C_2$ together form a resonance circuit having a resonance frequency of $f_1—\Delta_f$. Accordingly, the frequency discriminator has a so-called frequency discriminating characteristic around the frequency $f_1$ as shown in FIG. *5b*. It is to be understood that the linear portion of the characteristic range is wide enough to cover the maximum frequency deviation of the master oscillator O. The polarity of the discriminator K is determined so that the control loop consisting of the O–K–R circuit as determined by the output of the discriminator and the characteristics of the circuit R is such as to produce positive feedback characteristics in the discriminator sufficient to sustain oscillations therein. A phase compensation circuit P is interposed between the discriminator and the circuit R. In case the value of the gain $\varphi\omega$ of the O–K–R circuit, which is determined by the sensitivity $\varphi$ of the discriminator K and the reactance-sensitivity $\omega$ of the circuit R, is not less than 1, the discriminator circuit forms a kind of positive feedback circuit sufficient to sustain oscillations in the discriminator K and thus in the feedback type oscillator circuit O–K–R the output frequency of the master oscillator O will be swept over a wide frequency range of the discriminator centered at $f_1$ and having a width of $\pm(f_2—f_1)$. Accordingly, when $f_2$ approaches or coincides with $f_1$, the oscillation frequency $f_2$ of the master oscillator will be synchronized to $f_1$ through the operation of the phase comparator D and the filter F and the output of the discriminator K will be reduced to zero to maintain the normal circuit operation. It will be appreciated, therefore, that even if the oscillator output frequency $f_2$ widely deviates it can readily be brought into coincidence with the input signal frequency $f_1$.

Figure 3:
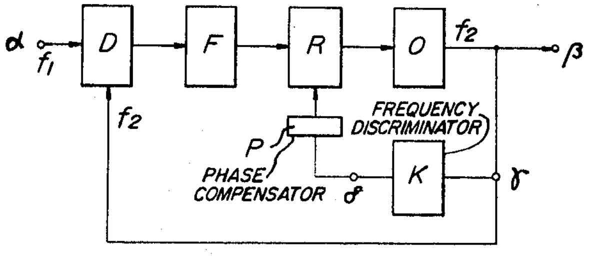
FIGS. 3 and 4 are diagrams similar to FIGS. 1 and 2 illustrating two different embodiments of the invention.
Figure 4:
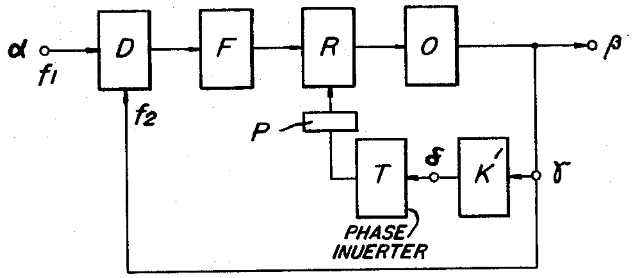
Figure 5A:
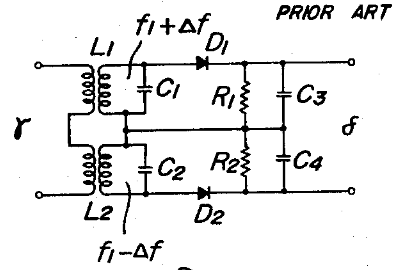
Fig. 5a PRIOR ART
Figure 5B:
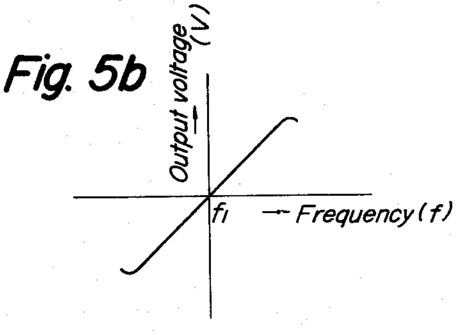

Further, in case a frequency discriminator K′ having a characteristic inverse to that illustrated in FIG. *5b* is employed in place of the above-described frequency discriminator K, the output of discriminator K′ to be applied to the circuit R may readily be placed in phase with the input signal component being applied to the circuit R to obtain the same advantages as with the case of FIG. 3 simply by employing a vacuum tube type phase inverter circuit T as shown in FIG. 4.

As apparent from the foregoing description, the automatic sweep type master oscillator of the present invention is highly advantageous over previous ones in that it employs a simplified circuit arrangement effective to obtain a signal in synchronism with the frequency of the input signal.

What is claimed is:

1. In an automatic phase control oscillator circuit including a phase comparator and an oscillator having a variable reactance circuit connected to the output of said phase comparator and arranged so that an external synchronizing signal and the output signal from said oscillator are applied to said phase comparator to obtain an output signal voltage corresponding to the phase difference between said signals, said output signal voltage being applied to said oscillator to synchronize the frequency of the oscillator output with that of said external input signal, the improvement essentially consisting of an automatic frequency oscillator control circuit, comprising feedback circuit means connected between the output of said oscillator and the input of said variable reactance circuit for providing an oscillator frequency control signal including frequency discriminator means having an output corresponding to the frequency difference between the signal output of said oscillator and the input signal for producing oscillatory control of said variable reactance circuit, said feedback circuit having a loop gain of not less than one.

2. A circuit as defined in claim 1 further including phase compensating means connected between the output of said frequency discriminator means and said variable reactance circuit for controlling the phase of said oscillator frequency control signal.

3. A circuit as defined in claim 2 wherein said frequency discriminator means consists of a frequency discriminator circuit having operating characteristics sufficient to effect sweep oscillation control over said oscillator.

4. In an automatic frequency sweep oscillator circuit including a phase comparator and an oscillator having a variable reactance circuit connected to the output of said phase comparator and arranged so that an external synchronizing signal and the output signal from said oscillator are applied to said phase comparator to obtain a signal voltage corresponding to the phase difference between said signals, said signal voltage being applied to said variable reactance circuit to synchronize the frequency of the oscillator output with that of said external input signal, frequency discriminator means for producing an output signal corresponding to the difference between the signal output frequency of said oscillator and the input signal frequency, the polarity of a control loop which consists of said oscillator, said frequency discriminator means, and said variable reactance circuit being made a positive feedback circuit and the amplification degree of the feedback circuit being not less than one.

5. A circuit as defined in claim 4 further including phase compensating means connected between the output of said frequency discriminator means and said variable reactance circuit for controlling the phase of said oscillator frequency control signal.

References Cited by the Examiner

UNITED STATES PATENTS

| | | | |
|---|---|---|---|
| 2,589,387 | 3/1952 | Hugenholtz | 331—11 X |
| 2,838,673 | 6/1958 | Fernsler et al. | 331—11 |
| 3,032,720 | 5/1962 | Bruch et al. | 331—11 |

FOREIGN PATENTS

| | | |
|---|---|---|
| 899,935 | 6/1962 | Great Britain. |

ROY LAKE, *Primary Examiner.*

S. H. GRIMM, *Assistant Examiner.*